(12) United States Patent
Nakatani et al.

(10) Patent No.: US 12,171,062 B2
(45) Date of Patent: Dec. 17, 2024

(54) ELECTRICALLY CONDUCTIVE ADHESIVE, ELECTRONIC CIRCUIT USING THE SAME, AND METHOD FOR MANUFACTURING SUCH ELECTRONIC CIRCUIT

(71) Applicant: TOYO ALUMINIUM KABUSHIKI KAISHA, Osaka (JP)

(72) Inventors: Toshio Nakatani, Osaka (JP); Hideaki Minamiyama, Osaka (JP)

(73) Assignee: TOYO ALUMINUM KABUSHIKI KAISHA, Osaka (JP)

( * ) Notice: Subject to any disclaimer, the term of this patent is extended or adjusted under 35 U.S.C. 154(b) by 19 days.

(21) Appl. No.: 18/024,527

(22) PCT Filed: Jul. 29, 2021

(86) PCT No.: PCT/JP2021/028020
§ 371 (c)(1),
(2) Date: Mar. 3, 2023

(87) PCT Pub. No.: WO2022/049937
PCT Pub. Date: Mar. 10, 2022

(65) Prior Publication Data
US 2023/0319988 A1 Oct. 5, 2023

(30) Foreign Application Priority Data
Sep. 3, 2020 (JP) .................. 2020-148215

(51) Int. Cl.
*H01B 1/22* (2006.01)
*H05K 1/09* (2006.01)
*H05K 3/38* (2006.01)

(52) U.S. Cl.
CPC ............. *H05K 1/095* (2013.01); *H05K 3/386* (2013.01); *H01B 1/22* (2013.01)

(58) Field of Classification Search
CPC .......... H05K 1/095; H05K 3/386; H05K 1/09; H05K 3/38; H01B 1/22; C08K 9/12;
(Continued)

(56) References Cited

U.S. PATENT DOCUMENTS 10,227,496 B2 3/2019 Minami et al.
2008/0261049 A1 10/2008 Hayashi et al.
(Continued)

FOREIGN PATENT DOCUMENTS

JP 2005317491 A 11/2005
JP 2007019006 A 1/2007
(Continued)

OTHER PUBLICATIONS

International Search Report PCT/JP2021/028020 dated Oct. 12, 2021 (pp. 1-3).

*Primary Examiner* — Mark Kopec
*Assistant Examiner* — Jaison P Thomas
(74) *Attorney, Agent, or Firm* — Millen, White, Zelano & Branigan; Brion P. Heaney (57) ABSTRACT

Objects of the present invention are to provide an electrically conductive adhesive which is capable of suppressing a rise in an electric resistance value of a joining part between an electronic component and a substrate under high temperature and high humidity while a specific resistance value is suppressed to be low; an electronic circuit using such electrically conductive adhesive; and a method for manufacturing such electronic circuit. According to the present invention, provided is the electrically conductive adhesive which includes an electrically conductive filler, a surface of the electrically conductive filler being a coating layer including silver, a compounded amount of the electrically conductive filler being 29.0 vol. % to 63.0 vol. % with respect to the electrically conductive adhesive, a compounded amount of
(Continued)

the silver being 3.5 vol. % to 7.0 vol. % with respect to the electrically conductive adhesive. In addition, also provided are an electronic circuit using the electrically conductive adhesive of the present invention and a method for manufacturing such electronic circuit.

12 Claims, 1 Drawing Sheet

(58) Field of Classification Search
CPC ...... C08K 2003/0806; C08K 2201/001; C08K 3/08; C08K 9/02; C09J 2203/326; C09J 2301/408; C09J 2463/00; C09J 11/04; C09J 9/02; C09J 2301/314; C09J 2400/12; C09J 2400/16
See application file for complete search history.

(56) References Cited

U.S. PATENT DOCUMENTS

| | | | |
|---|---|---|---|
| 2014/0339479 A1 | 11/2014 | Koike et al. | |
| 2021/0017428 A1* | 1/2021 | Abe | C09J 9/02 |

FOREIGN PATENT DOCUMENTS

| | | |
|---|---|---|
| JP | 2013149527 A | 8/2013 |
| JP | 2016207738 A | 12/2016 |
| JP | 2020100807 A | 7/2020 |
| WO | 2015107996 A1 | 7/2015 |

* cited by examiner

ELECTRICALLY CONDUCTIVE ADHESIVE, ELECTRONIC CIRCUIT USING THE SAME, AND METHOD FOR MANUFACTURING SUCH ELECTRONIC CIRCUIT

TECHNICAL FIELD

The present invention relates to an electrically conductive adhesive used to electrically join, for example, an electric component such as a semiconductor device onto a substrate having an electrically conductive part, an electronic circuit using such electrically conductive adhesive, and a method for manufacturing such electronic circuit.

BACKGROUND ART

In order to join an electronic component such as a semiconductor device onto a substrate, an electrically conductive adhesive, in which a thermosetting resin such as an epoxy resin and an electrically conductive filler such as silver powder are mixed, is used. The above-mentioned electrically conductive adhesive is used as a substitute for solder upon joining an electronic component such as a semiconductor device onto a substrate. Since the electrically conductive adhesive allows joining at a low temperature, as compared with the solder, using the electrically conductive adhesive for the electronic component which is likely to be damaged by heat is effective.

Incidentally, in general, there is a problem in that the electrically conductive adhesive causes a rise in an electric resistance value of a joining part under a high-temperature and high-humidity environment. Therefore, disclosed in Japanese Patent Application Laid-Open Publication No. 2016-222795 (Patent Literature 1) is a technology in which the rise in the electric resistance value of the joining part under the high-temperature and high-humidity environment is suppressed by adding zinc to the electrically conductive adhesive.

However, there is a problem in that by adding metal such as the zinc which shows high resistance, as compared with silver, thereto, a specific resistance value of the electrically conductive adhesive itself is increased.

CITATION LIST

Patent Literature

Patent Literature 1: Japanese Patent Application Laid-Open Publication No. 2016-222795

SUMMARY OF THE INVENTION

Technical Problem

Therefore, objects of the present invention are to provide a resin composition which is capable of suppressing a rise in an electric resistance value of a joining part between an electronic component and a substrate under high temperature and high humidity while a specific resistance value is suppressed to be low and an electrically conductive adhesive which includes such resin composition; an electronic circuit which uses such electrically conductive adhesive; and a method for manufacturing such electronic circuit.

Solution to Problem

The present inventors have devoted themselves to earnest research as to an added amount and the like of silver, which is effective to suppress a rise in an electric resistance value of a joining part between an electronic component and a substrate. As a result, the present inventors have found out that by using an electrically conductive filler whose surface is coated with silver, the rise in the electric resistance value of the joining part between the electronic component and the substrate under high temperature and high humidity can be suppressed while a specific resistance value is suppressed to be low. In other words, the present inventors have found out that since by using the electrically conductive filler whose surface is coated with the silver, even with a small amount of the silver, the electrically conductive filler accounts for a predetermined volume ratio, a flow passage through which electricity flows in the whole electrically conductive adhesive is ensured and since the amount of the silver is suppressed to be a predetermined amount, the rise in the electric resistance value of the joining part under high temperature and high humidity is suppressed, thus reaching the completion of the present invention.

According to the present invention, provided is an electrically conductive adhesive including an electrically conductive filler, a surface of the electrically conductive filler being a coating layer including silver, a compounded amount of the electrically conductive filler being 29.0 vol. % to 63.0 vol. % with respect to the electrically conductive adhesive, a compounded amount of the silver being 3.5 vol. % to 7.0 vol. % with respect to the electrically conductive adhesive.

The electrically conductive adhesive of the present invention is capable of suppressing the rise in the electric resistance value of the joining part between the electronic component and the substrate under high temperature and high humidity while the specific resistance value is suppressed to be low.

Note that in the description of the present application, a range of numerical values (rates) shown by using "to" shows a range including numerical values (rates) described before and after "to" as a minimum value (rate) and a maximum value (rate).

<Electrically Conductive Adhesive>

The electrically conductive adhesive of the present invention is an adhesive which includes an electrically conductive filler, a thermosetting resin, and a curing agent. In addition, in a range in which effects of the present invention are not impaired, as needed, a reactive diluent, a curing accelerator, a filler (for example, silica, alumina, boron nitride, aluminum nitride, or the like), a coloring agent (for example, carbon black, dye, or the like), a flame retardant, an ion trapping agent, a leveling agent, an antifoaming agent, a dispersing agent, an anticorrosive agent, or the like may be added to the electrically conductive adhesive of the present invention.

<Electrically Conductive Filler>

The electrically conductive filler in the present invention means powder having electrical conductivity. The electrically conductive filler used in the present invention is an electrically conductive filler whose core is metal baser than silver or a ceramic and whose surface is coated with the silver. In addition, it is preferable that the core of the electrically conductive filler is a core including at least one kind selected from the group consisting of alumina, silica, copper, and aluminum.

As an example of metal coated ceramic particles, silver plated ceramic particles obtained by plating a surface of alumina or silica with silver or an alloy including silver are cited. As the core of metal baser than the silver, aluminum or copper is cited.

In addition, a shape of the electrically conductive filler is not particularly limited and in a case of the particles, particles each having a spherical shape, a flaky (flattened) shape, a fibrous shape, a rod-like shape, or the like can be used. It is preferable that an average particle diameter ($D_{50}$) is 1 μm to 50 μm and it is more preferable that the average particle diameter ($D_{50}$) is 2 μm to 20 μm. If the average particle diameter ($D_{50}$) is 1 μm or less, a specific surface area of the filler increases and a used amount of the silver with a volume ratio of the electrically conductive filler maintained cannot be suppressed, whereby there may be a case where both of suppression of the specific resistance value and suppression of the rise in the electric resistance of the joining part cannot be accomplished. On the other hand, if the average particle diameter ($D_{50}$) is 50 μm or more, it is difficult to draw fine lines and there may be a case where upon application in which dispensing is employed, discharging from a nozzle is made impossible.

The average particle diameter ($D_{50}$) can be measured by using a particle diameter distribution measuring apparatus (for example, an apparatus name Microtrac MT3300II manufactured by NIKKISO CO., LTD.) using a laser diffraction scattering method. Note that the average particle diameter ($D_{50}$) in the present description shows a value measured by the laser diffraction scattering method and means a volume-based median diameter.

In addition, it is preferable that in a case where a total volume of the electrically conductive adhesive is 100 vol. %, an added amount of the electrically conductive filler to the adhesive is 29.0 vol. % to 63.0 vol. %. If the added amount of the electrically conductive filler is smaller than 29.0 vol. %, a resistance value increases and if the added amount thereof is larger than 63.0 vol. %, a viscosity of the electrically conductive adhesive increases and kneading or discharging upon dispensing is made difficult.

Furthermore, it is preferable that in the case where the total volume of the electrically conductive adhesive is 100 vol. %, a content of the silver in the electrically conductive filler is 3.5 vol. % to 7.0 vol. %. If the content of the silver is smaller than 3.5 vol. %, the resistance value increases and if the content thereof is larger than 7.0 vol. %, with the lapse of time, the rise in the electric resistance value of the joining part between the electronic component and the substrate cannot be suppressed.

<Thermosetting Resin>

The thermosetting resin in the present invention means resin which cures by heating. As the thermosetting resin used in the present invention, any thermosetting resin can be used without being particularly limited. By using, as the thermosetting resin, an epoxy resin such as a bisphenol A type epoxy resin, a bisphenol F type epoxy resin, a chelate modified epoxy resin, an amine type epoxy resin, and an alicyclic epoxy resin, excellent printability and mechanical strength can be obtained. In addition, other than the above-mentioned epoxy resins, an unsaturated polyester resin, a polyimide resin, a thermosetting acrylic resin, or the like can be used.

<Reactive Diluent>

The reactive diluent in the present invention is a diluent which dilutes the electrically conductive adhesive and means a diluent which has a polymerizable functional group. In the electrically conductive adhesive of the present invention, by using the reactive diluent as needed, an electrically conductive adhesive which has an appropriate viscosity in accordance with a method of printing or application to an element, a substrate, and the like, can be prepared.

As such a reactive diluent, cited is coconut fatty acid glycidyl ester, butyl glycidyl ether, 2-ethylhexyl glycidyl ether, allyl glycidyl ether, p-sec-butylphenyl glycidyl ether, p-tert-butylphenyl glycidyl ether, glycidol, polyethylene glycol-diglycidyl ether, glycidyl methacrylate, glycerol monomethacrylate, styrene oxide, or the like.

It is preferable that in a case where a total weight of the electrically conductive adhesive is 100 wt. %, an added amount of the above-mentioned reactive diluent is 1.0 wt. % to 10.0 wt. % and it is more preferable that the added amount thereof is 3.0 wt. % to 8.0 wt. %. The added amount thereof is 1.0 wt. % or more and 10.0 wt. % or less, thereby allowing a viscosity of the electrically conductive adhesive to be within an appropriate range and obtaining favorable printability.

<Curing Accelerator>

In order to appropriate curability, in the electrically conductive adhesive of the present invention, the curing accelerator can be blended. As long as this curing accelerator is an epoxy resin and can be used as the curing accelerator, this curing accelerator is not particularly limited and the heretofore known curing accelerator can be used. It is preferable that the curing accelerator can be stored in a state in which the curing accelerator is previously mixed in the epoxy resin and a curing accelerator which can be used as a one liquid type epoxy resin electrically conductive adhesive is used.

For example, when the curing accelerator is a cationic polymerization initiator, cited as an example is benzyl methyl p-methoxycarbonyl phenyl sulfonium=hexafluoroantimonate; 1-naphthylmethyl methyl p-hydroxyphenyl sulfonium=hexafluoroantimonate; 2-methyl benzyl methyl p-hydroxyphenyl sulfonium=hexafluoroantimonate; benzyl methyl p-hydroxyphenyl sulfonium hexafluoroantimonate; benzyl (4-hydroxyphenyl) (methyl) sulfonium=hexafluorophosphate; dimethyl p-acetoxyphenyl sulfonium=hexafluoroantimonate; or the like.

In addition, when the curing accelerator is of a solid dispersion-heat curing type, cited as an example is a dicyandiamide type curing accelerator; a dihydrazide compound; an amine adduct-based latent curing agent; a polyamine type curing accelerator; 2-phenyl-4-methylimidazole; 3-(3,4-dichlorophenyl)-1,1-dimethylurea; or the like, and also cited as the example is onium salt; boron halide; vinyl ether blocked carboxylic acid; active ester of polycarboxylic acid; a ketimine compound; a reactive group block type curing accelerator such as a silanol group-containing polymer; or the like.

As an imidazole-based curing accelerator, cited as an example are an imidazole compound and a derivative thereof, and cited is, for example, 2-methylimidazole; 2-ethyl-4-methylimidazole; 2-phenylimidazole; 2-phenyl-4-methylimidazole; 2-phenyl-4,5-dihydroxymethylimidazole; 2-phenyl-4-methyl-5-hydroxymethylimidazole; an epoxy-imidazole adduct; or the like.

Although a used amount of the curing accelerator varies depending on a kind of the curing accelerator to be used and a kind of the epoxy resin to be used, it is preferable that the curing accelerator is added at a rate of 5.0 pts. wt. to 40.0 pts. wt. of the curing accelerator with respect to 100 pts. wt. of the epoxy resin.

A method for preparing the electrically conductive adhesive of the present invention is not particularly limited and the components can be uniformly mixed at predetermined blending rates by employing mixing means such as a mortar machine, a propeller agitator, a kneader, a pot mill, a three roll mill, a rotary mixer, and a double-shaft mixer, thereby allowing the electrically conductive adhesive to be prepared. A resin composition in which the epoxy resin, the curing accelerator, and the reactive diluent are previously blended can also be prepared, and the electrically conductive filler, a filler to be added as needed, and the like are collectively mixed, thereby preparing the electrically conductive adhesive.

The electrically conductive adhesive of the present invention may be in an ink state and can be printed or applied onto the substrate by employing any method such as screen printing, gravure printing, and dispensing.

In a case where an organic solvent is used as a diluent, after printing or application, a circuit element to be joined is mounted and thereafter, at an ambient temperature or under heating, the organic solvent is volatilized. Subsequently, in accordance with the kind of the resin and the kind of the curing accelerator, the electrically conductive adhesive is cured by heating at a temperature of 120° C. to 180° C. for 20 to 60 minutes, thereby joining the circuit element.

As described above, a circuit board electronic device obtained by mounting, on a substrate, a semiconductor device, a solar battery cell, a thermoelectric element, a chip component, a discrete component, or an electric component obtained by combining the semiconductor device, the solar battery cell, the thermoelectric element, the chip component, and the discrete component by using the electrically conductive adhesive can be formed. In addition, an electronic device obtained by forming wiring of a film antenna, a keyboard membrane, a touch panel, and an RFID antenna and connecting, onto the substrate, the film antenna, the keyboard membrane, the touch panel, and the RFID antenna by using the electrically conductive adhesive can also be formed.

Advantageous Effects of the Invention

By employing an electrically conductive adhesive, an electronic circuit using such electrically conductive adhesive, and a method for manufacturing such electronic circuit according to the present invention, excellent effects that a rise in an electric resistance value of a joining part between an electronic component and a substrate under high temperature and high humidity can be suppressed while a specific resistance value is suppressed to be low can be exhibited.

DESCRIPTION OF EMBODIMENT

Hereinafter, with reference to the accompanying drawings, an electrically conductive adhesive, an electronic circuit using such electrically conductive adhesive, and a method for manufacturing such electronic circuit according to one embodiment of the present invention will be described in detail. Note that the present invention is not limited to an embodiment set forth below and a variety of modifications can be made without departing from the technical ideas of the present invention.

EXAMPLES

1. Preparation of Electrically Conductive Adhesives

Electrically conductive adhesives according to one embodiment of the present invention and electrically conductive adhesives in Comparative Examples were prepared by using the following materials and under the following conditions (refer to "Table 1").

Example 1

2 g (9.6 vol. % with respect to the prepared electrically conductive adhesive and hereinafter, a compounded amount of each material is written jointly along with "vol. %" with respect to the same criterion) of an epoxy resin (a product name "EP49-10N" manufactured by ADEKA Corporation); 6 g (30.0 vol. %) of an epoxy resin (a product name "EP-4088S" manufactured by ADEKA Corporation); 1.38 g (8.5 vol. %) of a reactive diluent (a product name "EPIOL B" manufactured by NOF CORPORATION); 1.41 g (5.8 vol. %) of a curing accelerator (a product name: "SAN-AID SI-100L" manufactured by SANSHIN CHEMICAL INDUSTRY CO., LTD.); and as an electrically conductive filler, 39.5 g (46.1 vol. %) of blockish silver plating alumina powder (a product name "TFM-L05B", an average particle diameter ($D_{50}$): 5 μm, a silver content (a coating amount): 13.9 vol. % (6.4 vol. % with respect to the prepared electrically conductive adhesive), manufactured by Toyo Aluminium K.K.) were blended in a disposable cup having a capacity of 200 ml and were evenly mixed by a spatula and thereafter, were further mixed by using a three roll mill (a product name "EXAKT 80S PLUS" manufactured by Nagase Screen Printing Research Co., Ltd.) with roll spacings of 0.05 mm and 0.03 mm, thereby preparing an electrically conductive adhesive in Example 1.

Example 2

An electrically conductive adhesive in Example 2 was prepared under the same conditions as those in Example 1 such as compounded amounts (g) of components except that the electrically conductive filler was changed to spherical silver plating silica powder (a product name: "TFM-S02P", an average particle diameter ($D_{50}$): 2 μm, a silver content (a coating amount): 8.3 vol. % (5.1 vol. % with respect to the prepared electrically conductive adhesive), manufactured by Toyo Aluminium K.K.) in an amount of 43.8 g (61.1 vol. % with respect to the prepared electrically conductive adhesive).

In other words, 2 g (6.9 vol. %) of an epoxy resin A (a product name: "EP49-10N" manufactured by ADEKA Corporation); 6 g (21.7 vol. %) of an epoxy resin B (a product name "EP-4088S" manufactured by ADEKA Corporation); 1.38 g (6.1 vol. %) of a reactive diluent (a product name "EPIOL B" manufactured by NOF CORPORATION); 1.41 g (4.2 vol. %) of a curing accelerator (a product name: "SAN-AID SI-100L manufactured by SANSHIN CHEMICAL INDUSTRY CO., LTD.); and as an electrically conductive filler, 43.8 g (61.1 vol. %) of spherical silver plating silica powder (a product name: "TFM-S02P", an average particle diameter ($D_{50}$): 2 μm, a silver content (a coating amount): 8.3 vol. % (5.1 vol. % with respect to the prepared electrically conductive adhesive), manufactured by Toyo Aluminium K.K.) were blended in a disposable cup having a capacity of 200 ml and were evenly mixed by a spatula and thereafter, were further mixed by using a three roll mill (a product name: "EXAKT 80S PLUS" manufactured by Nagase Screen Printing Research Co., Ltd.) with roll spacings of 0.05 mm and 0.03 mm, thereby preparing the electrically conductive adhesive in Example 2.

Example 3

An electrically conductive adhesive in Example 3 was prepared under the same conditions as those in Example 1 such as compounded amounts (g) of components except that the curing accelerator was changed to a curing accelerator with a product name SAN-AID SI-150L (manufactured by SANSHIN CHEMICAL INDUSTRY CO., LTD.) in an amount of 1.41 g (5.7 vol. % with respect to the prepared electrically conductive adhesive).

Example 4

An electrically conductive adhesive in Example 4 was prepared under the same conditions as those in Example 2 such as compounded amounts (g) of components except that the compounded amount of the spherical silver plating silica powder as the electrically conductive filler (a product name "TFM-S02P", an average particle diameter ($D_{50}$): 2 μm, a silver content (a coating amount): 8.3 vol. % (3.8 vol. % with respect to the prepared electrically conductive adhesive) manufactured by Toyo Aluminium K.K.) was changed to 23.5 g (45.7 vol. % with respect to the prepared electrically conductive adhesive).

Example 5

An electrically conductive adhesive in Example 5 was prepared under the same conditions as those in Example 1 such as compounded amounts (g) of components except that the compounded amount of the blockish silver plating alumina powder as an electrically conductive filler (a product name "TFM-L05B", an average particle diameter ($D_{50}$): 5 μm, a silver content (a coating amount): 13.9 vol. % (6.8 vol. % with respect to the prepared electrically conductive adhesive) manufactured by Toyo Aluminium K.K.) was changed to 45.0 g (49.3 vol. % with respect to the prepared electrically conductive adhesive).

Example 6

An electrically conductive adhesive in Example 6 was prepared under the same conditions as those in Example 1 such as compounded amounts (g) of components except that the compounded amount of the blockish silver plating alumina powder as the electrically conductive filler (a product name: "TFM-L05B", an average particle diameter ($D_{50}$): 5 μm, a silver content (a coating amount): 13.9 vol. % (5.9 vol. % with respect to the prepared electrically conductive adhesive) manufactured by Toyo Aluminium K.K.) was changed to 35.0 g (43.0 vol. % with respect to the prepared electrically conductive adhesive).

Example 7

An electrically conductive adhesive in Example 7 was prepared under the same conditions as those in Example 2 such as compounded amounts (g) of components except that the resin was changed to a resin with a product name AER8000 (manufactured by Asahi Kasei Corp.) in an amount of 8 g (27.4 vol. % with respect to the prepared electrically conductive adhesive).

Example 8

An electrically conductive adhesive in Example 8 was prepared under the same conditions as those in Example 1 such as compounded amounts (g) of components except that the electrically conductive filler was changed to flaky silver plating copper flakes (a product name: "TFM-C05F" (an average particle diameter ($D_{50}$): 5 μm, a silver content (a coating amount): 16.8 vol. % (5.3 vol. % with respect to the prepared electrically conductive adhesive) manufactured by Toyo Aluminium K.K.) in an amount of 39.5 g (30.8 vol. % with respect to the prepared electrically conductive adhesive).

Example 9

An electrically conductive adhesive in Example 9 was prepared under the same conditions as those in Example 1 such as compounded amounts (g) of components except that the electrically conductive filler was changed to spherical silver plating aluminum powder (a product name "TFM-A05P" (an average particle diameter ($D_{50}$): 5 μm, a silver content (a coating amount): 10.0 vol. % (5.3 vol. % with respect to the prepared electrically conductive adhesive) manufactured by Toyo Aluminium K.K.) in an amount of 39.5 g (53.5 vol. % with respect to the prepared electrically conductive adhesive) and the curing accelerator was changed to a curing accelerator (a product name "SAN-AID SI-100L" manufactured by SANSHIN CHEMICAL INDUSTRY CO., LTD.) in an amount of 1.65 g (5.8 vol. %).

Comparative Example 1

An electrically conductive adhesive in Comparative Example 1 was prepared under the same conditions as those in Example 1 such as compounded amounts (g) of components except that the electrically conductive filler was changed to silver particles (a product name "AgC104WR" manufactured by FUKUDA METAL FOIL & POWDER CO., LTD.) in an amount of 20 g (16.5 vol. % with respect to the prepared electrically conductive adhesive).

Comparative Example 2

An electrically conductive adhesive in Comparative Example 2 was prepared under the same conditions as those in Example 1 such as compounded amounts (g) of components except that the electrically conductive filler was changed to silver particles (a product name "AgC104WR" manufactured by FUKUDA METAL FOIL & POWDER CO., LTD.) in an amount of 30 g (22.9 vol. % with respect to the prepared electrically conductive adhesive).

Comparative Example 3

An electrically conductive adhesive in Comparative Example 3 was prepared under the same conditions as those in Example 1 such as compounded amounts (g) of components except that the electrically conductive filler was changed to silver particles (a product name "AgC104WR" manufactured by FUKUDA METAL FOIL & POWDER CO., LTD.) in an amount of 88.0 g (46.5 vol. % with respect to the prepared electrically conductive adhesive).

Comparative Example 4

An electrically conductive adhesive in Comparative Example 4 was prepared under the same conditions as those in Example 2 such as compounded amounts (g) of components except that the compounded amount of the spherical silver plating silica powder as the electrically conductive filler (a product name: "TFM-S02P", an average particle diameter ($D_{50}$): 2 μm, a silver content (a coating amount): 8.3 vol. % (5.4 vol. % with respect to the prepared electrically conductive adhesive) manufactured by Toyo Aluminium K.K.) was changed to 51.1 g (64.7 vol. % with respect to the prepared electrically conductive adhesive).

Comparative Example 5

An electrically conductive adhesive in Comparative Example 5 was prepared under the same conditions as those in Example 1 such as compounded amounts (g) of components except that the electrically conductive filler was changed to flaky silver plating copper flakes (a product name: "TFM-C05F" (an average particle diameter ($D_{50}$): 5 μm, a silver content (a coating amount): 16.8 vol. % (4.4 vol. % with respect to the prepared electrically conductive adhesive) manufactured by Toyo Aluminium K.K.) in an amount of 30.0 g (25.3 vol. % with respect to the prepared electrically conductive adhesive).

The compounded amounts (vol. %) (g) of the components blended in the electrically conductive adhesives Examples 1 to 9 and Comparative Examples 1 to 5 are shown in Table 1.

TABLE 1

| | Electrically conductive filler | | | Silver content with respect to adhesive | Resin A | | | Resin B |
|---|---|---|---|---|---|---|---|---|
| | | Compounded amount | | | | Compounded amount | | |
| | Kind | (Vol %) | (g) | (Vol %) | Kind | (g) | (Vol %) | Kind |
| Example 1 | Silver plating alumina powder (TFM-L05B) | 46.1 | 39.5 | 6.4 | EP49-10N | 2.0 | 9.6 | EP-4088S |
| Example 2 | Silver plating silica powder (TFM-S02P) | 61.1 | 43.8 | 5.1 | EP49-10N | 2.0 | 6.9 | EP-4088S |
| Example 3 | Silver plating alumina powder (TFM-L05B) | 46.1 | 39.5 | 6.4 | EP49-10N | 2.0 | 9.6 | EP-4088S |
| Example 4 | Silver plating silica powder (TFM-S02P) | 45.7 | 23.5 | 3.8 | EP49-10N | 2.0 | 9.6 | EP-4088S |
| Example 5 | Silver plating alumina powder (TFM-L05B) | 49.3 | 45.0 | 6.8 | EP49-10N | 2.0 | 9.0 | EP-4088S |
| Example 6 | Silver plating alumina powder (TFM-L05B) | 43.0 | 35.0 | 5.9 | EP49-10N | 2.0 | 10.1 | EP-4088S |
| Example 7 | Silver plating silica powder (TFM-S02P) | 62.1 | 43.8 | 5.2 | AER8000 | 8.0 | 27.4 | — |
| Example 8 | Silver plating copper flakes (TFM-C05F) | 30.8 | 39.5 | 5.3 | EP49-10N | 2.0 | 12.3 | EP-4088S |
| Example 9 | Silver plating aluminum powder (TFM-A05B) | 53.5 | 39.5 | 5.3 | EP49-10N | 2.0 | 8.1 | EP-4088S |
| Comparative Example 1 | Silver powder (AgC104WR) | 16.5 | 20.0 | 16.5 | EP49-10N | 2.0 | 14.8 | EP-4088S |
| Comparative Example 2 | Silver powder (AgC104WR) | 22.9 | 30.0 | 22.9 | EP49-10N | 2.0 | 13.7 | EP-4088S |
| Comparative Example 3 | Silver powder (AgC104WR) | 46.5 | 88.0 | 46.5 | EP49-10N | 2.0 | 9.5 | EP-4088S |
| Comparative Example 4 | Silver plating silica powder (TFM-S02P) | 64.7 | 51.1 | 5.4 | EP49-10N | 2.0 | 6.3 | EP-4088S |
| Comparative Example 5 | Silver plating copper flakes (TFM-C05F) | 25.3 | 30.0 | 4.4 | EP49-10N | 2.0 | 13.2 | EP-4088S |

TABLE 1-continued

|  | Resin B | | Reactive diluent | | | Curing accelerator | | | Total |
|---|---|---|---|---|---|---|---|---|---|
|  | Compounded amount | | | Compounded amount | | | Compounded amount | | |
|  | (g) | (Vol %) | Kind | (g) | (Vol %) | Kind | (g) | (Vol %) | (Vol %) |
| Example 1 | 6.0 | 30.0 | EPIOL B | 1.38 | 8.5 | SI-100L | 1.41 | 5.8 | 100.0 |
| Example 2 | 6.0 | 21.7 | EPIOL B | 1.38 | 6.1 | SI-100L | 1.41 | 4.2 | 100.0 |
| Example 3 | 6.0 | 30.1 | EPIOL B | 1.38 | 8.5 | SI-150L | 1.41 | 5.7 | 100.0 |
| Example 4 | 6.0 | 30.2 | EPIOL B | 1.38 | 8.6 | SI-100L | 1.41 | 5.9 | 100.0 |
| Example 5 | 6.0 | 28.2 | EPIOL B | 1.38 | 8.0 | SI-100L | 1.41 | 5.5 | 100.0 |
| Example 6 | 6.0 | 31.7 | EPIOL B | 1.38 | 9.0 | SI-100L | 1.41 | 6.2 | 100.0 |
| Example 7 | — | — | EPIOL B | 1.38 | 6.2 | SI-100L | 1.41 | 4.3 | 100.0 |
| Example 8 | 6.0 | 38.5 | EPIOL B | 1.38 | 10.9 | SI-100L | 1.41 | 7.5 | 100.0 |
| Example 9 | 6.0 | 25.4 | EPIOL B | 1.38 | 7.2 | SI-100L | 1.65 | 5.8 | 100.0 |
| Comparative Example 1 | 6.0 | 46.5 | EPIOL B | 1.38 | 13.1 | SI-100L | 1.41 | 9.1 | 100.0 |
| Comparative Example 2 | 6.0 | 42.9 | EPIOL B | 1.38 | 12.1 | SI-100L | 1.41 | 8.4 | 100.0 |
| Comparative Example 3 | 6.0 | 29.8 | EPIOL B | 1.38 | 8.4 | SI-100L | 1.41 | 5.8 | 100.0 |
| Comparative Example 4 | 6.0 | 19.7 | EPIOL B | 1.38 | 5.5 | SI-100L | 1.41 | 3.8 | 100.0 |
| Comparative Example 5 | 6.0 | 41.6 | EPIOL B | 1.38 | 11.8 | SI-100L | 1.41 | 8.1 | 100.0 |

2. Measurement of Resistance Value

Figure 1:
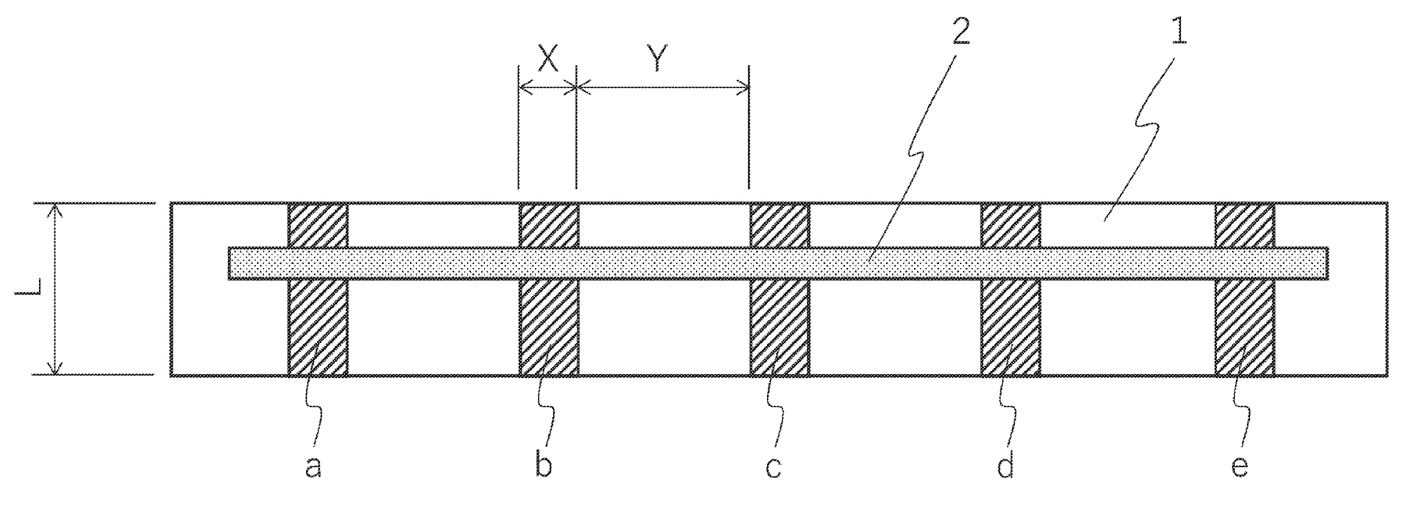
FIG. 1 is a schematic drawing schematically showing a circuit board for measuring a resistance value.

As shown in FIG. 1, an aluminum etching circuit board (9 μm-thick aluminum foil/250 μm-thick PET film) or a copper etching circuit board (12 μm-thick copper foil/250 μm-thick PET film), whose line width of foil was 5 mm, length of the foil was 10 mm, and distance between pieces of the foil was 10 mm, was prepared and by using a screen printing machine (DP-320 type screen printer manufactured by NEWLONG SEIMITSU KOGYO CO., LTD.), a 2.5 mm-wide×50 μm-thick or less electrically conductive adhesive was printed in such a way that each of the electrically conductive adhesives in Examples 1 to 10 and Comparative Examples 1 to 5 crossed on an aluminum etching circuit or a copper etching circuit.

After printing, each of the electrically conductive adhesives was cured at a temperature of 150° C. for a period of 30 minutes and by using a resistance meter (a device name "3541 9771 pin type lead" manufactured by HIOKI E.E. CORPORATION), a change in a resistance value between a and b (FIG. 1) at the lapse of zero hour, 100 hours, 200 hours, 300 hours, 400 hours, and 500 hours under a high-temperature and high-humidity environment at 85° C. and 85% was measured. Specifically, the pin type lead was brought in contact with an electrically conductive body (aluminum foil or copper foil) which was a circuit wire and each resistance value was measured.

Note that the measurement of the resistance value using the aluminum etching circuit board was conducted as to each of the electrically conductive adhesives in Examples 1 to 9 and Comparative Examples 1 to 5. In addition, since the measurement of the resistance value using the copper etching circuit board was conducted as to only the electrically conductive adhesive in Example 3, a measurement method and measurement results of this resistance value are shown as those in "Example 10".

3. Measurement of Specific Resistance Value

For measurement of each specific resistance value, as to each sample obtained by applying each of the electrically conductive adhesives in Examples 1 to 9 and Comparative Examples 1 to 5 onto the PET film by using an applicator in such a way that a thickness thereof after drying was 30 μm to 40 μm and by conducting curing at a temperature of 150° C. for a period of 30 minutes, any three points thereof at the lapse of zero hour and 500 hours were measured by using a four probe type surface resistance meter (a product name "Loresta-GP" manufactured by Mitsubishi Chemical Analytech) and an average thereof was defined as a specific resistance value (Ω·cm). Specifically, data of dimensions of the electrically conductive coating film, an average coating film thickness, and coordinates of the measurement points was inputted into the four probe type surface resistance meter, and each value obtained by causing the four probe type surface resistance meter to perform automatic calculation was defined as the specific resistance value of the electrically conductive coating film. Note that it is shown that the smaller the specific resistance value is, the more excellent electrical conductivity is. In addition, an adhesive thickness was measured by a digimatic standard outside micrometer (a product name "IP65 COOLANT PROOF Micrometer" manufactured by Mitutoyo Corporation) and confirmation was thereby made.

4. Measurement of Viscosity

A viscosity of each of the electrically conductive adhesives in Examples 1 to 9 and Comparative Examples 1 to 5 was measured by a B type viscometer (Model No.: DV2THBCJ0 manufactured by AMETEK Brookfield) at a temperature of 25° C. and at a revolving speed of 2.5 rpm.

Measurement results of the viscosity of each of the electrically conductive adhesives in Examples 1 to 10 and Comparative Examples 1 to 5, the specific resistance value thereof, and the resistance value thereof under a constant-temperature and constant-humidity environment at 85° C. and 85% are shown in Table 2.

TABLE 2

| | Viscosity (Pa·s) | Specific resistance value (Ω·cm) 0 hour | Specific resistance value (Ω·cm) 500 hours | Kind of circuit board | Resistance value (Ω) 0 hour | Resistance value (Ω) 100 hours | Resistance value (Ω) 200 hours | Resistance value (Ω) 300 hours | Resistance value (Ω) 400 hours | Resistance value (Ω) 500 hours |
|---|---|---|---|---|---|---|---|---|---|---|
| Example 1 | 20.1 | $5.0 \times 10^{-4}$ | $3.3 \times 10^{-4}$ | Aluminum | 0.68 | 0.85 | 1.48 | 1.98 | 2.07 | 5.00 |
| Example 2 | 56.2 | $3.3 \times 10^{-4}$ | $5.3 \times 10^{-4}$ | Aluminum | 0.49 | 1.77 | 2.45 | 3.69 | 5.62 | 9.95 |
| Example 3 | 17.4 | $6.7 \times 10^{-4}$ | $8.2 \times 10^{-4}$ | Aluminum | 0.96 | 1.31 | 2.99 | 1.99 | 2.51 | 3.29 |
| Example 4 | 11.1 | $8.1 \times 10^{-4}$ | $1.0 \times 10^{-3}$ | Aluminum | 1.29 | 10.92 | 18.36 | 40.21 | 219.64 | 1345.99 |
| Example 5 | 22.2 | $2.6 \times 10^{-4}$ | $3.2 \times 10^{-4}$ | Aluminum | 0.84 | 1.24 | 1.83 | 2.61 | 3.28 | 3.72 |
| Example 6 | 15.6 | $4.2 \times 10^{-4}$ | $5.1 \times 10^{-4}$ | Aluminum | 0.74 | 0.89 | 0.98 | 1.03 | 1.13 | 1.35 |
| Example 7 | 83.4 | $5.0 \times 10^{-4}$ | $6.0 \times 10^{-4}$ | Aluminum | 0.88 | 2.49 | 3.32 | 8.24 | 13.27 | 18.16 |
| Example 8 | 42.4 | $2.4 \times 10^{-3}$ | $3.7 \times 10^{-3}$ | Aluminum | 0.76 | 0.91 | 1.04 | 1.13 | 1.21 | 1.28 |
| Example 9 | 34.1 | $5.0 \times 10^{-4}$ | $4.3 \times 10^{-4}$ | Aluminum | 0.68 | 2.53 | 3.68 | 2.00 | 1.54 | 1.84 |
| Example 10 | Same as in Example 3 | Same as in Example 3 | Same as in Example 3 | Copper | 0.86 | 0.98 | 1.04 | 1.08 | 1.07 | 1.03 |
| Comparative Example 1 | 17.2 | $4.6 \times 10^{-4}$ | $3.8 \times 10^{-4}$ | Aluminum | 5.13 | 8.52 | 15.55 | 70.68 | — | — |
| Comparative Example 2 | 43.7 | $2.3 \times 10^{-3}$ | $6.6 \times 10^{-4}$ | Aluminum | 5.11 | — | — | — | — | — |
| Comparative Example 3 | Unable to be measure | $2.9 \times 10^{-2}$ | — | Aluminum | 76.70 | — | — | — | — | — |
| Comparative Example 4 | Unable to be kneaded | — | — | Aluminum | Impossible to be measured since kneading was unable. | | | | | |
| Comparative Example 5 | 21.5 | $1.5 \times 10^{-1}$ | — | Aluminum | Impossible to be measured since the specific resistance value was excessively high. | | | | | |

※ The electrically conductive adhesive in "Example 10" was the same as the electrically conductive adhesive in Example 3 and in Example 10, the copper circuit board used upon measuring the resistance value was used.

5. Discussion

As shown in Table 2, in a case of the electrically conductive adhesives in Comparative Examples 1 and 2, in each of which as the electrically conductive filler, the silver particles themselves were used, obtained were results in that as to the electrically conductive adhesive in Comparative Example 1, the resistance value increased until it was impossible to measure the resistance value at the lapse of 400 hours, and as to the electrically conductive adhesive in Comparative Example 2, the resistance value increased until it was impossible to measure the resistance value at the lapse of 100 hours. As described above, it was confirmed that although in the case where as the electrically conductive filler, the silver particles themselves were used, it was effective to suppress the specific resistance value to be low, a rise in the electric resistance value of the joining part between the electronic component and the substrate under high temperature and high humidity was incurred.

In addition, it was found from Table 2 that when the electrically conductive adhesives in Examples 1 to 10 and Comparative Examples 1 to 5 were compared, when the added amount of the electrically conductive filler was smaller than 29.0 vol. %, the resistance value increased and when the added amount of the electrically conductive filler was larger than 63.0 vol. %, the viscosity of the electrically conductive adhesive increased, thereby making kneading or discharging upon dispensing difficult. Therefore, it was preferable that the added amount of the electrically conductive filler into the adhesive was 29.0 vol. % to 63.0 vol. % when a total volume of the electrically conductive adhesive was 100 vol. %.

Furthermore, it was found that when the silver content in the electrically conductive filler was smaller than 3.5 vol. % with respect to the electrically conductive adhesive, the resistance value increased and when the silver content therein was larger than 7.0 vol. % with respect thereto, with the lapse of time, it became impossible to suppress the rise in the electric resistance value of the joining part between the electronic component and the substrate. Therefore, it was preferable that the silver content in the electrically conductive filler was 3.5 vol. % to 7.0 vol. % when the total volume of the electrically conductive adhesive was 100 vol. %.

REFERENCE SIGNS LIST

1: Circuit board
2: Electrically conductive adhesive
a to e: Circuit
X: Circuit width
Y: Circuit spacing
L: Circuit length

The invention claimed is:

1. An electrically conductive adhesive comprising:
an electrically conductive filler, a surface of the electrically conductive filler being a coating layer including silver,
wherein a compounded amount of the electrically conductive filler is 29.0 vol. % to 63.0 vol. % with respect to the electrically conductive adhesive,
wherein a compounded amount of the silver is 3.5 vol. % to 7.0 vol. % with respect to the electrically conductive adhesive, and
wherein the electrically conductive filler has a core comprising alumina, silica, or aluminum.

2. The electrically conductive adhesive according to claim 1, wherein the electrically conductive adhesive is in an ink state.

3. An electronic circuit, comprising:
a resin substrate having an electrically conductive part, and
a semiconductor device, a thermoelectric element, a chip component, an LED component, or an electric component in which the semiconductor device, the thermoelectric element, the chip component, and the LED component are combined, wherein the semiconductor device, thermoelectric element, chip component, LED component, or electric component is electrically joined onto the resin substrate by the electrically conductive adhesive according to claim 1.

4. The electronic circuit according to claim 3, wherein the electrically conductive part of the resin substrate is made of aluminum or copper.

5. A method for manufacturing an electronic circuit comprising: applying the electrically conductive adhesive according to claim 1 onto a resin substrate having an electrically conductive part by dispensing, screen printing, or gravure printing the electrically conductive adhesive.

6. The electrically conductive adhesive according to claim 1, further comprising a thermosetting resin and a curing agent.

7. The electrically conductive adhesive according to claim 6, further comprising a reactive diluent, a curing accelerator, a filler, a coloring agent, a flame retardant, an ion trapping agent, a leveling agent, an antifoaming agent, a dispersing agent, an anticorrosive agent, or any combination thereof.

8. The electrically conductive adhesive according to claim 6, wherein the thermosetting resin is an epoxy resin, an unsaturated polyester resin, a polyimide resin, or a thermosetting acrylic resin.

9. The electrically conductive adhesive according to claim 6, further comprising a reactive diluent in an amount of 1.0 wt. % to 10.0 wt. % with respect to the electrically conductive adhesive.

10. The electrically conductive adhesive according to claim 1, wherein the electrically conductive filler is in the form of particles having an average particle diameter ($D_{50}$) is 1 μm to 50 μm.

11. The electrically conductive adhesive according to claim 1, wherein the electrically conductive filler is in the form of particles having an average particle diameter ($D_{50}$) is 2 μm to 20 μm.

12. The electrically conductive adhesive according to claim 1, wherein the compounded amount of the silver is 3.5 vol. % to 5.3 vol. % with respect to the electrically conductive adhesive.

* * * * *